United States Patent
Yonekawa et al.

(10) Patent No.: US 6,972,235 B2
(45) Date of Patent: Dec. 6, 2005

(54) METHOD FOR PROCESSING SEMICONDUCTOR SUBSTRATE

(75) Inventors: Tsukasa Yonekawa, Tokyo (JP); Keisuke Suzuki, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/494,530
(22) PCT Filed: Sep. 16, 2003
(86) PCT No.: PCT/JP03/11771

§ 371 (c)(1),
(2), (4) Date: May 17, 2004

(87) PCT Pub. No.: WO2004/027857

PCT Pub. Date: Apr. 1, 2004

(65) Prior Publication Data

US 2005/0003629 A1  Jan. 6, 2005

(30) Foreign Application Priority Data

Sep. 19, 2002 (JP) .............................. 2002-273854

(51) Int. Cl.⁷ .......................................... H01L 21/336
(52) U.S. Cl. ..................................... 438/296; 438/701
(58) Field of Search ............................... 438/243, 248, 438/294–296, 386–391, 424–429, 435–439, 438/700–703

(56) References Cited

U.S. PATENT DOCUMENTS 6,291,310 B1 * 9/2001 Madson et al. ............. 438/424
6,825,087 B1 * 11/2004 Sharp et al. ................ 438/296

FOREIGN PATENT DOCUMENTS

| JP | 10-12716 | 1/1998 |
| JP | 2000-58780 | 2/2000 |
| JP | 2002-190514 | 7/2002 |

OTHER PUBLICATIONS

Tsutomu Sato et al., 'Trench Transformation Technology using Hydrogen Annealing for Realizing Highly Reliable Device Structure with Thin Dielectric Films', In: 1998 Symposium on VLSI Technology Digest of Technical Papers: IEEE, 1998, pp. 206 to 207.

S. Matsuda et al., 'Novel Corner Rounding Process for Shallow Trench Isolation utilizing MSTS (Micro-Structure Transformation of Silicon)', In: IEDM 1998: IEEE, 1998, pp. 137 to 140.

Kazuo Maeda, "VLSI Process Sochi Handbook", Kogyo Chosakai Publishing Co., Ltd., Jun. 10, 1990, pp. 155 to 157, 230 to 247.

* cited by examiner

Primary Examiner—David Nelms
Assistant Examiner—Calvin Lee
(74) Attorney, Agent, or Firm—Oblon, Spivak, McClelland, Maier & Neustadt, P.C.

(57) ABSTRACT

A method of processing a semiconductor substrate includes a step of forming a trench (16) in a surface of the substrate, by etching the substrate (W), and a step of rounding a corner (10) of the substrate formed at a mouth of the trench (16), by heat-processing the substrate (W). The step of rounding the corner (10) includes a first heat process performed in a hydrogen gas atmosphere with a process temperature T set to be 850° C.<T<1,050° C., and a process pressure P set to be 0.01 kPa<P<30 kPa.

9 Claims, 7 Drawing Sheets

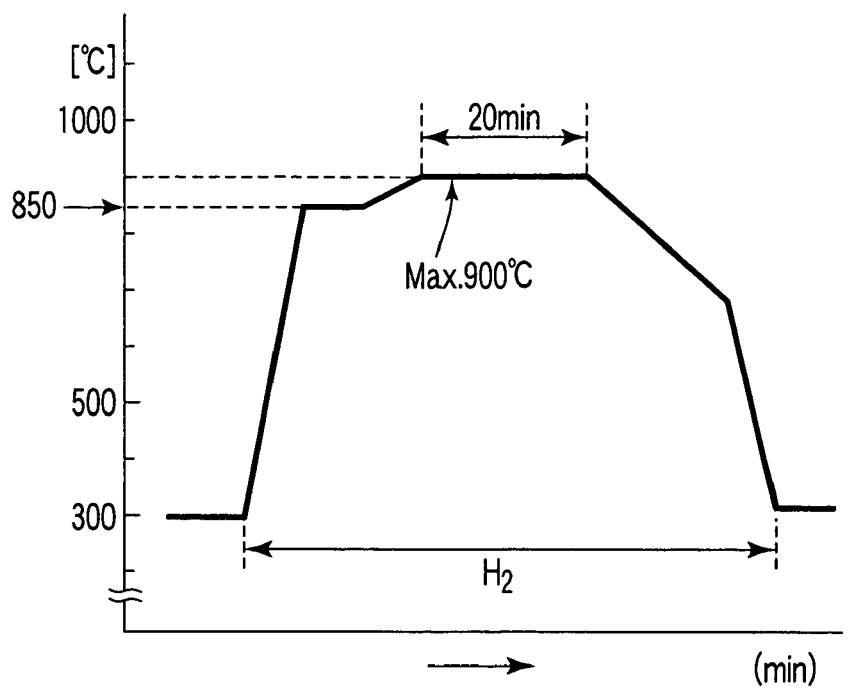
F I G. 5
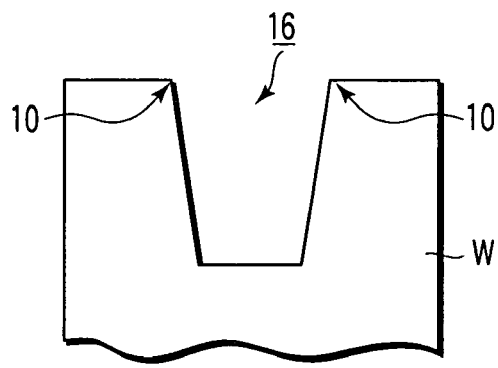
F I G. 7A
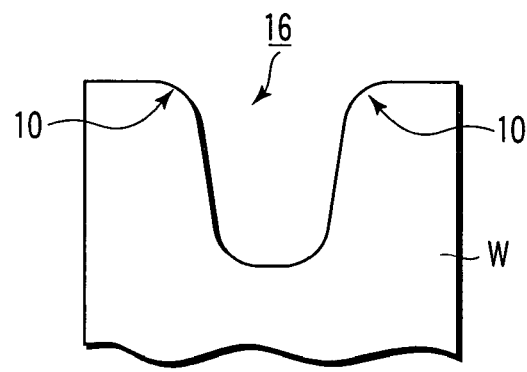
F I G. 7B
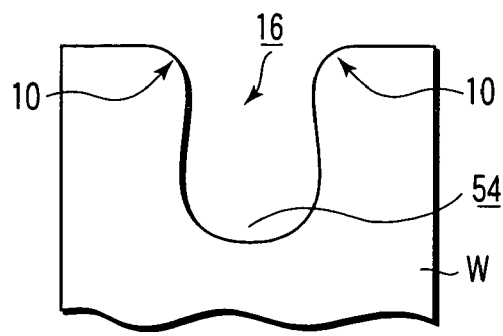
F I G. 7C

METHOD FOR PROCESSING SEMICONDUCTOR SUBSTRATE

TECHNICAL FIELD

The present invention relates to a method of processing a semiconductor substrate, a method of forming a device isolation region for separating a device region on a semiconductor substrate, a method of manufacturing a semiconductor device having a gate structure on a device region adjacent to a device isolation region, and a heat-processing apparatus for a semiconductor substrate. More specifically, the present invention provides an improved trench structure according to the methods described above.

BACKGROUND ART

Where a number of device units, such as transistors, are arrayed on a semiconductor substrate (silicon substrate or compound semiconductor substrate), the device units are respectively formed in device regions that are electrically isolated from each other by device isolation regions. As a device isolation region, there is known a trench isolation structure that includes a trench formed in the surface of a semiconductor substrate, and an insulator, such as silicon oxide film, filling the trench.

FIG. 8 is an enlarged sectional view showing a conventional trench isolation structure. As shown in FIG. 8, trenches are formed by pattern-etching the surface of a semiconductor substrate W, and each of them is filled with an insulator 2, such as a silicon oxide film. The insulators 2 surround device regions 4 to electrically isolate the device region 4 from each other. FIG. 8 shows, as an example, the gate oxide film 6 and gate electrode 8 of a MOS transistor formed in each device region 4 (FIG. 8 shows a sectional view in the channel width direction).

As described above, the surface of a semiconductor substrate W is etched to form the trenches of device isolation regions. With this etching, each of substrate surface corners 10, i.e., the trench edges (a substrate corner is formed between a device region and a device isolation region), has an angle of, e.g., about 90 degrees. Where the corners 10 have such an angle, the oxidation rate tends to be lower at the corners 10, when an oxide film (gate oxide film 6) is formed on the surface of the semiconductor substrate W. As a consequence, the gate oxide film 6 has a film thickness H1 at the corners 10 far smaller than that at the other portions. If the gate oxide film 6 has a smaller film thickness locally at the corners 10, leakage current is generated there, because electrical field concentration occurs at the corners 10.

One countermeasure to this problem is a processing method for rounding the trench edge corners of the device isolation regions, so as to prevent the gate oxide film from being thinner at the corners 10. FIGS. 9A to 9F are sectional views showing a series of steps in a conventional semiconductor substrate processing method for rounding the trench edge corners of device isolation regions. FIG. 10 is an enlarged sectional view showing a conventional trench isolation structure formed at the end of the processing method shown in FIGS. 9A to 9F.

First, as shown in FIG. 9A, a first insulating film 12 consisting of, e.g., a silicon oxide film, and a second insulating film 14 consisting of, e.g., a silicon nitride film are formed and laminated in this order on the surface of a semiconductor (silicon) substrate W. Then, as shown in FIG. 9B, trenches (grooves) 16 are formed in a predetermined pattern by etching, such that each trench 16 extends from the surface of the first and second insulating films 12 and 14 into the semiconductor substrate W.

Then, an oxidizing process is performed at a high temperature in an oxygen atmosphere, thereby oxidizing the side surfaces of the trenches 16 exposed to the oxygen atmosphere, to form a thin liner oxide film 18 thereon, as shown in FIG. 9C. With the liner oxide film 18 thus formed, each of the substrate surface corners 10, i.e., the edges of the trenches 16, is provided with a curved portion 18A of the liner oxide film 18 that is continuously disposed thereon as a curved projection.

Then, as shown in FIG. 9D, a silicon oxide film 20 is deposited by CVD (Chemical Vapor Deposition) over all the device regions and device isolation regions to fill the trenches 16. Then, as shown in FIG. 9E, the silicon oxide film 20 is etched to a position where the uppermost second insulating film 14 is exposed.

Then, as shown in FIG. 9F, the second insulating film 14 and first insulating film 12 are sequentially removed by etching, while leaving the silicon oxide film 20 filling the trenches 16. As a consequence, the device regions are electrically isolated from each other by the device isolation regions. The curved portion 18A of the liner oxide film 18 remains curved. Thereafter, as described above, gate oxide films 6 and gate electrodes 8 (see FIG. 10) are formed to fabricate transistors.

According to the method described above, as shown in FIG. 10, each of the corners 10, i.e., the trench edges, is provided with the curved portion 18A of the liner oxide film 18 continuously disposed thereon. As a consequence, the gate oxide film 6 has a sufficient film thickness H2 at the corners 10 to prevent leakage current from generating, as that at the other portions.

Incidentally, since semiconductor integration circuits are required to be more integrated and miniaturized in recent years, the trenches 16 need to have a smaller width. For example, the trenches 16 need to have a width L1 (see FIG. 9B) as small as about 0.1 $\mu$m. In this case, where the liner oxide film 18 is formed, as described above, the mouth of each trench 16 becomes very narrow, even if the liner oxide film 18 has a small film thickness of, e.g., about 15 nm. As a consequence, it becomes difficult to sufficiently fill the trenches 16 with the silicon oxide film 20 in a subsequent step, thereby creating voids in the trenches 16.

Jpn. Pat. Appln. KOKAI Publication No. 2000-58780 discloses another processing method for rounding substrate surface corners 10, i.e., the trench edges, without forming the liner oxide film 18 (see pages 13 to 15, FIGS. 50 to 66). In this processing method, after trenches 16 are formed, as shown in FIG. 9B, the entire semiconductor substrate W is heat-treated at a high temperature in a hydrogen atmosphere. By doing so, atomic migration is thermally caused in the silicon surface, and thereby rounds the corners 10.

However, it has been found by the present inventors' experiments, that the processing method disclosed in this publication has insufficiencies in the process conditions, which bring about other problems. Examples of the problems are that surface roughness excessively occurs on the side surfaces of the edges of trenches 16, and migration excessively occurs and considerably deforms the shape of trenches 16.

DISCLOSURE OF INVENTION

An object of the present invention is to provide an improved trench structure, in a method of processing a semiconductor substrate, a method of forming a device isolation region for separating a device region on a semiconductor substrate, a method of manufacturing a semiconductor device having a gate structure on a device region adjacent to a device isolation region.

According to a first aspect of the present invention, there is provided a method of processing is a semiconductor substrate, the method comprising:

forming a trench in a surface of the substrate, by etching the substrate; and rounding a corner of the substrate formed at a mouth of the trench, by heat-processing the substrate, wherein rounding the corner comprises a first heat process performed in a hydrogen gas atmosphere with a process temperature T set to be 850° C.<T<1,050° C., and a process pressure P set to be 0.01 kPa<P<30 kPa.

According to a second aspect of the present invention, there is provided a method of forming a device isolation region for separating a device region on a semiconductor substrate, the method comprising:

forming a process insulating film on the substrate;

forming a trench extending from a surface of the process insulating film into the substrate, by etching a portion corresponding to the device isolation region;

rounding a corner of the substrate formed at a boundary between the trench and the device region, by heat-processing the substrate while leaving the process insulating film disposed on the device region, wherein rounding the corner comprises a first heat process performed in a hydrogen gas atmosphere with a process temperature T set to be 850° C.<T<1,050° C., and a process pressure P set to be 0.01 kPa<P<30 kPa;

performing, subsequently to the first heat process, a second heat process to cover a surface inside the trench with a protection oxide film, by oxidizing the substrate while heating the substrate;

forming a deposition film of an insulator in the trench and on the device region while leaving the process insulating film disposed on the device region; and removing both the deposition film and the process insulating film on the device region, thereby leaving an filling insulator in the trench, and forming an exposed surface of the substrate in the device region.

According to a third aspect of the present invention, there is provided a method of manufacturing a semiconductor device including a gate structure on a device region adjacent to a device isolation region, the method comprising:

forming a process insulating film on a semiconductor substrate used as a substrate of the semiconductor device;

forming a trench extending from a surface of the process insulating film into the substrate, by etching a portion corresponding to the device isolation region;

rounding a corner of the substrate formed at a boundary between the trench and the device region, by heat-processing the substrate, wherein rounding the corner comprises a first heat process performed in a hydrogen gas atmosphere with a process temperature T set to be 850° C.<T<1,050° C., and a process pressure P set to be 0.01 kPa<P<30 kPa;

performing, subsequently to the first heat process, a second heat process to cover a surface inside the trench with a protection oxide film, by oxidizing the substrate while heating the substrate;

forming a filling insulator in the trench;

forming an exposed surface of the substrate in the device region, after forming the filling insulator; and forming a gate insulating film and a gate electrode in this order over the exposed surface and the corner.

According to a fourth aspect of the present invention, there is provided a heat-processing apparatus for a semiconductor substrate, the apparatus comprising:

a process chamber configured to accommodate the substrate;

a support member configured to support the substrate in the process chamber;

a heater configured to heat the substrate accommodated in the process chamber;

a gas supply system configured to supply a process gas into the process chamber;

an exhaust system configured to exhaust the process chamber; and a controller configured to control an operation of the processing apparatus, wherein the controller is set to successively perform first and second heat processes on the substrate, which has been provided with a trench formed in a surface thereof, in the process chamber, the first heat process is performed to round a corner of the substrate formed at a mouth of the trench, in a hydrogen gas atmosphere with a process temperature T set to be 850° C.<T<1,050° C., and a process pressure P set to be 0.01 kPa<P<30 kPa, and the second heat process is performed to cover a surface inside the trench with a protection oxide film, by oxidizing the substrate while heating the substrate.

BRIEF DESCRIPTION OF DRAWINGS

FIG. 5 is a graph showing other change in the temperature of semiconductor substrates, used in the evaluation experiment in the step of rounding corners;

FIGS. 7A to 7C are schematic views showing change in the shape of a trench;

BEST MODE FOR CARRYING OUT THE INVENTION

Figure 1:
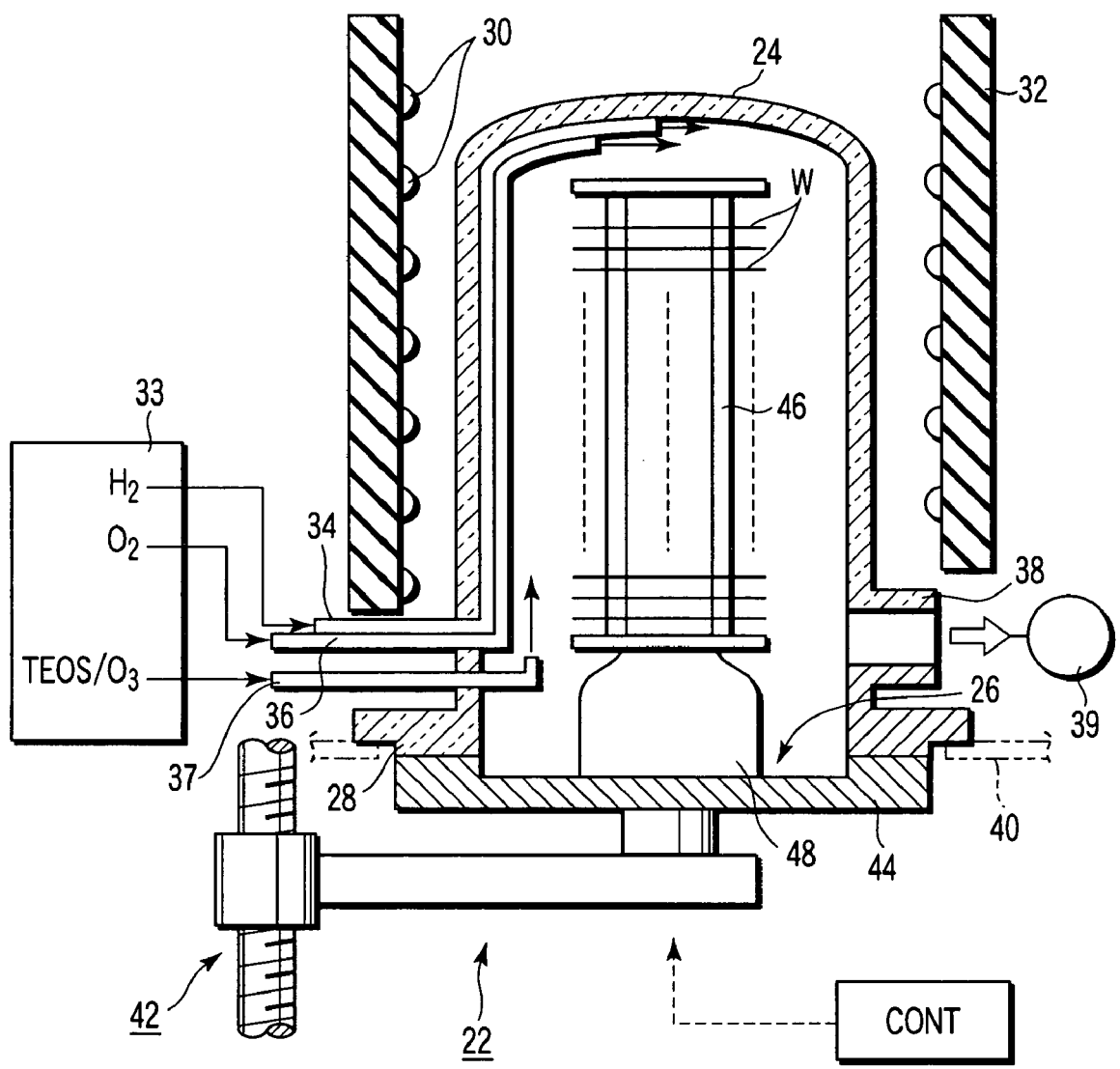
FIG. 1 is a sectional view schematically showing a vertical heat-processing apparatus for performing a method of manufacturing a semiconductor device according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

FIG. 1 is a sectional view schematically showing a vertical heat-processing apparatus for performing a method of manufacturing a semiconductor device according to an embodiment of the present invention.

As shown in FIG. 1, this vertical heat-processing apparatus 22 has a process container 24 made of quartz and shaped as cylindrical column with a ceiling. The bottom of the process container 24 is opened to form a port 26 with a flange 28 formed around it for connection. The process container 24 is surrounded by a cylindrical heat insulator 32, which is provided with a heater 30 or heating means disposed on the inner side, thereby constituting a furnace.

A hydrogen feed nozzle 34 for feeding hydrogen and an oxygen feed nozzle 36 for feeding oxygen are disposed to penetrate a lower portion of the sidewall of the process container 24. The nozzles 34 and 36 extend along the inner surface of the sidewall of the process container 24 to the ceiling, so as to spout gases therefrom at flow rates controlled as needed. Nozzles 37 for feeding TEOS (tetraethylorthosilicate) and $O_3$, which are used when a CVD film of an insulator is formed, are also disposed to penetrate a lower portion of the sidewall of the process container 24 (although TEOS and $O_3$ are supplied through different nozzles, they are shown as a single nozzle). The nozzles 34, 36, and 37 are connected to a gas supply section 33.

An exhaust port 38 having a relatively large diameter is formed in a lower portion of the sidewall of the process container 24, and is connected to an exhaust section 39 including an exhaust pump or the like. The exhaust section 39 exhausts the atmosphere inside the process container 24 to set the interior at a predetermined vacuum level.

A stainless steel base plate 40 is disposed to support the outer portion of the flange 28 of the process container 24, so as to support the entirety of the process container 24. The port 26 at the bottom of the process container 24 is opened and closed by a cap 44, which is made of quartz or stainless steel and moved up and down by an elevating mechanism 42. A quartz support boat 46, on which semiconductor substrates W are placed at a predetermined pitch in the vertical direction, is placed on the cap 44 through a cylindrical holder 48. The support boat 46 is loaded into and unloaded from the process container 24 by moving the cap 44 up and down. The support boat 46 may be rotated or not rotated.

The entire operation of the vertical heat-processing apparatus 22 is controlled in accordance with a program preset in a control section CONT. Under the control of the control section CONT, a predetermined process is performed in the heat-processing apparatus 22, for example, as follows.

First, semiconductor substrates W are transferred onto the support boat 46 in an unload state where the elevating mechanism 42 is placed at a lower position. For example, the support boat 46 is designed to stack 50 to 100 8-inch wafers with a gap therebetween. At this time, these semiconductor substrates W have already been subjected to a predetermined process in a previous step, as described later. Then, the cap 44 is moved up along with the support boat 46 by the elevating mechanism 42 to load the support boat 46 through the bottom port 26 into the process container 24. Then, the bottom port 26 of the process container 24 is airtightly closed by the cap 44 to hermetically seal the process container 24.

Then, the temperature of the heater 30 is raised to heat the semiconductor substrates W to a predetermined process temperature. Also, while the interior of the process container 24 is exhausted, a necessary process gas, such as hydrogen gas or oxygen gas, is supplied at a flow rate controlled as needed. By doing so, a predetermined heat process is performed while the process pressure in the process container 24 is kept at a predetermined pressure. In this heat-processing apparatus 22, a rounding step and a surface oxidation step both described later are sequentially performed in practice. Furthermore, in this heat-processing apparatus 22, a step of forming a CVD film of an insulator is performed subsequently to these steps.

Next, with reference to FIGS. 1 to 3, an explanation will be given of a method of manufacturing a semiconductor device according to an embodiment of the present invention (including a method of forming a device isolation region and a method of processing a semiconductor substrate), which is performed under the control of the control section CONT. FIGS. 2A to 2H are sectional views showing a series of steps in a method of manufacturing a semiconductor device according to an embodiment of the present invention (including a method of forming a device isolation region and a method of processing a semiconductor substrate). FIG. 3 is a graph showing change in the temperature of processing steps performed, using the heat-processing apparatus shown in FIG. 1.

Figure 2A:
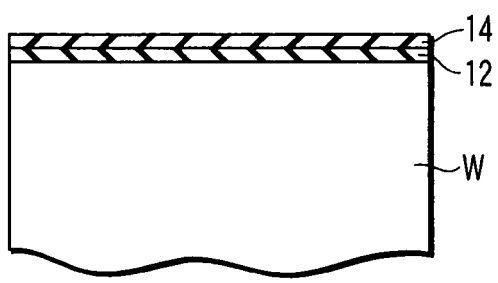
FIGS. 2A to 2H are sectional views showing a series of steps in a method of manufacturing a semiconductor device according to an embodiment of the present invention (including a method of forming a device isolation region and a method of processing a semiconductor substrate)
Figure 3:
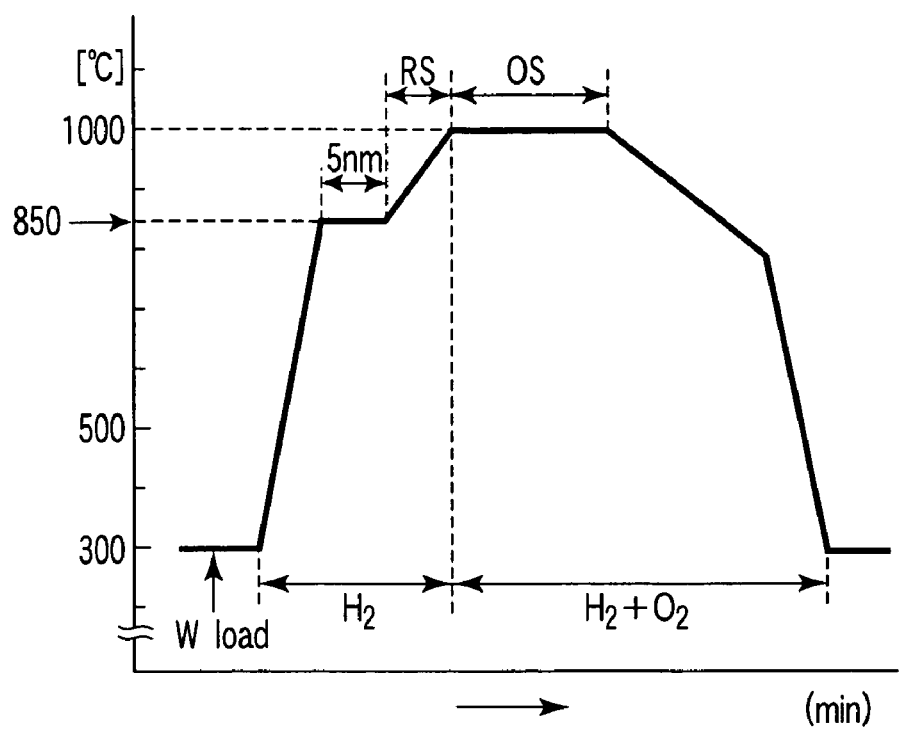
FIG. 3 is a graph showing change in the temperature of processing steps performed, using the heat-processing apparatus shown in FIG. 1.

First, as shown in FIG. 2A, a first insulating film 12 formed of, e.g., a silicon oxide film and a second insulating film 14 formed of, e.g., a silicon nitride film are deposited in this order on the surface of a semiconductor substrate W consisting of silicon or a compound semiconductor. The first insulating film 12 and second insulating film 14 are not limited to these examples. For example, the first insulating film 12 may be formed of an oxynitride film, or the second insulating film 14 may be formed of an oxynitride film.

Figure 2B:
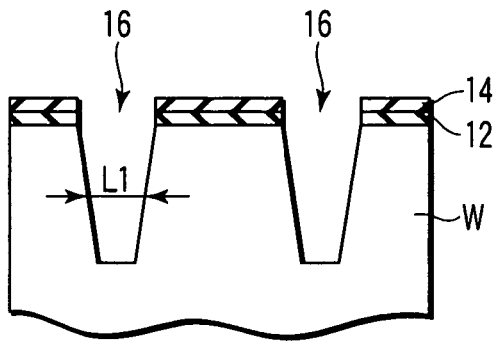

Then, as shown in FIG. 2B, trenches (grooves) 16 are formed by etching portions to be device isolation regions, from the surface of the second insulating film 14 into the semiconductor substrate W. In this embodiment, for example, plasma is used to etch the first and second insulating films 12 and 14 and the semiconductor substrate W, so as to form the trenches 16 in a predetermined pattern. The width L1 of each trench 16 is set at, e.g., about 0.1 $\mu$m.

Figure 2C:
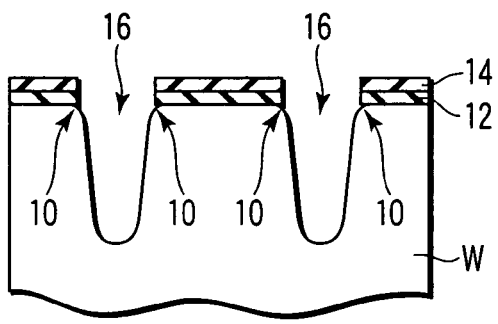
Figure 2D:
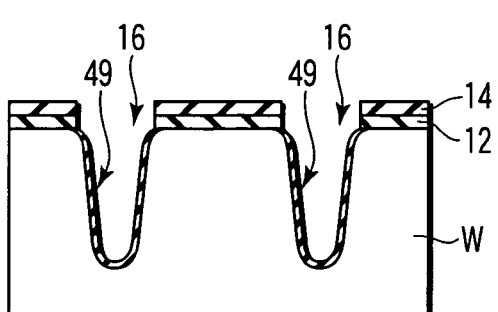

Then, semiconductor substrates W with trenches 16 thus formed in their surfaces are transferred into the process container 24 of the heat-processing apparatus 22 described with reference to FIG. 1. Then, the semiconductor substrates W are subjected to a rounding step (first heat process) RS shown in FIG. 2C, and a surface oxidation step (second heat process) OS shown in FIG. 2D, conducted in series in this process container 24. Furthermore, they may be subsequently subjected to a step of forming a CVD film of an insulator described later, conducted as a third heat process. As shown in FIGS. 2C to 2D, these steps are performed while the first and second insulating films 12 and 14 remain on device regions.

More specifically, as also shown in FIG. 3, in the rounding step RS, the semiconductor substrates W are transferred (loaded) into the process container 24 heated at, e.g., about 300° C., and then hydrogen gas starts being supplied into the process container 24. The semiconductor substrates W are quickly heated to about 850° C. and kept at this temperature for about 5 minutes to stabilize the temperature of the semiconductor substrates W. The process pressure is set at, e.g., about 1 kPa.

After the substrate temperature becomes stable, the temperature of the semiconductor substrates W is raised to a temperature of 850° C. to 1,050° C., e.g., 1,000° C. This completes the rounding step RS. As described later, where the temperature of the semiconductor substrates W is raised to 1,000° C., atomic migration is thermally caused in the material surfaces of the semiconductor substrate W, thereby changing the surfaces into a deformable state, in a moment when the semiconductor substrates W are exposed to this temperature. As a consequence, as shown in FIG. 2C, substrate surface corners 10, i.e., the edges of the trenches 16, are rounded with a predetermined curvature, and the rounding step RS is thereby completed. In this step, the flow rate of hydrogen gas is set at, e.g., about 2 to 30 liters/minute, depending on the volume of the process container 24.

After the rounding step RS is thus completed, i.e., the temperature of the semiconductor substrates W is raised to 1,000° C., which is an example of the process temperature, the surface oxidation step OS follows. In the surface oxidation step OS, the temperature of the semiconductor substrates W is maintained as it is, i.e., at 1,000° C. Hydrogen and oxygen are supplied at the same time as process gases. The flow rate of hydrogen is set at, e.g., about 1 liter/minute, and the flow rate of oxygen is set at, e.g., about 2 liters/minute. The process pressure is set at a very low pressure, which is not more than 133 Pa (1 Torr) and not less than 1.33 Pa (0.01 Torr).

In other words, the surface oxidation step OS is performed by a so-called low pressure radical oxidizing process (LPRO: Low Pressure Radical Oxidation), (for example, it is disclosed in U.S. Pat. No. 6,599,845). In the low pressure radical oxidizing process, water vapor is generated from oxygen radicals and hydroxy radicals, and uniformly oxidizes the semiconductor substrate surface and more specifically the silicon surface exposed inside the trenches 16. As a consequence, a thin protection oxide film 49 consisting of $SiO_2$ is formed, such that it has a thickness of, e.g., about 6 nm in a case where the process is performed for about 6 minutes. The protection oxide film 49 protects the inner surface of the trenches 16, which has been damaged by the plasma etching shown in FIG. 2B. In this step, gas supply rates, process temperature, and process pressure may be adjusted in ranges that allow the low pressure radical oxidizing process described above to be performed.

Figure 2E:
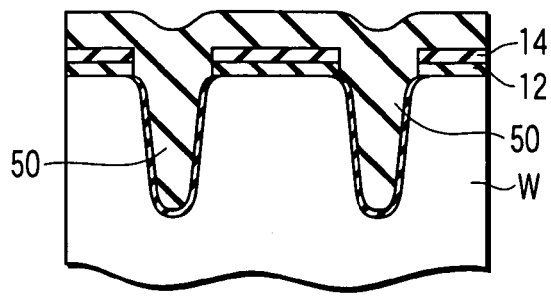

After the surface oxidation step OS is thus completed, the semiconductor substrates W are unloaded from the process container 24 to the outside. Then, the same processing apparatus or another processing apparatus is used to perform a filling step on the semiconductor substrates W by, e.g., a plasma CVD process, such as a HDP (High Density Plasma) process or $TEOS/O_3$ process. In this step, as shown in FIG. 2E, the trenches 16 are filled with an insulator 50, such as silicon oxide, and a deposition film of the insulator 50 is formed over the entire surface of the substrate (i.e., including the surface of the device regions).

Figure 2F:
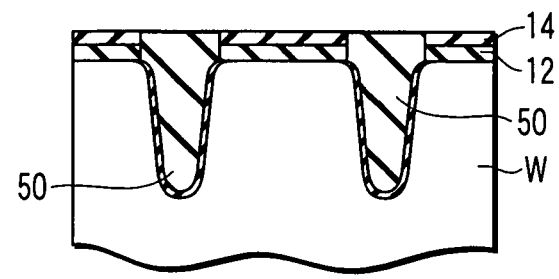

After the filling step is thus completed, as shown in FIG. 2F, an etching process or CMP process is performed to remove the insulator deposition film 50, so as to expose the surface of the second insulating film 14. Since the insulator deposition film 50 consists of silicon oxide while the second insulating film 14 consists of silicon nitride, a sufficiently large etching selectivity is obtained between the two materials. As a consequence, the etching of the insulator deposition film 50 can be easily stopped at a position corresponding to the second insulating film 14.

Figure 2G:
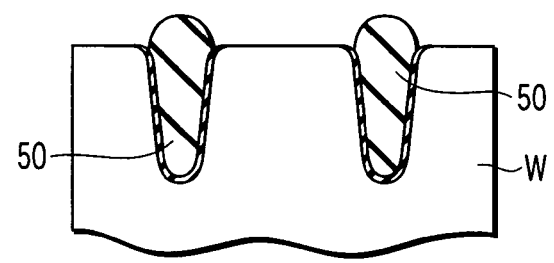

Then, as shown in FIG. 2G, the insulator deposition film 50, second insulating film 14, and first insulating film 12 on the device regions are removed in this order by etching processes. In this step, the top portion of the insulator 50 is slightly removed. As a consequence, the filling insulator 50 is left in the trenches 16, and the exposed surface of the substrate W is obtained in the device regions. In this state, the device regions are separated and electrically isolated by the device isolation regions each formed of the trench 16 filled with the insulator 50.

Figure 2H:
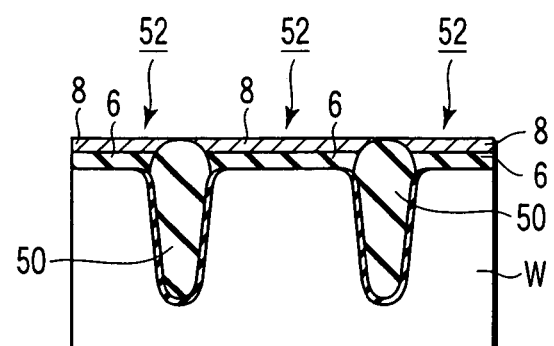

Then, as shown in FIG. 2H, gate insulating films 6 and gate electrode 8 are sequentially formed in a predetermined pattern to cover portions each extending over the exposed surface and the corners 10 of each device region. Then, an impurity is diffused into the device regions to form source and drain layers (not shown) in the surface of each device region, while using, as a mask, gate structures each formed of the insulating film 6 and gate electrode 8 and having a predetermined shape. As a consequence, MOS transistors (semiconductor devices) 52 are fabricated (FIG. 2H shows a sectional view in the channel width direction).

Figure 10:
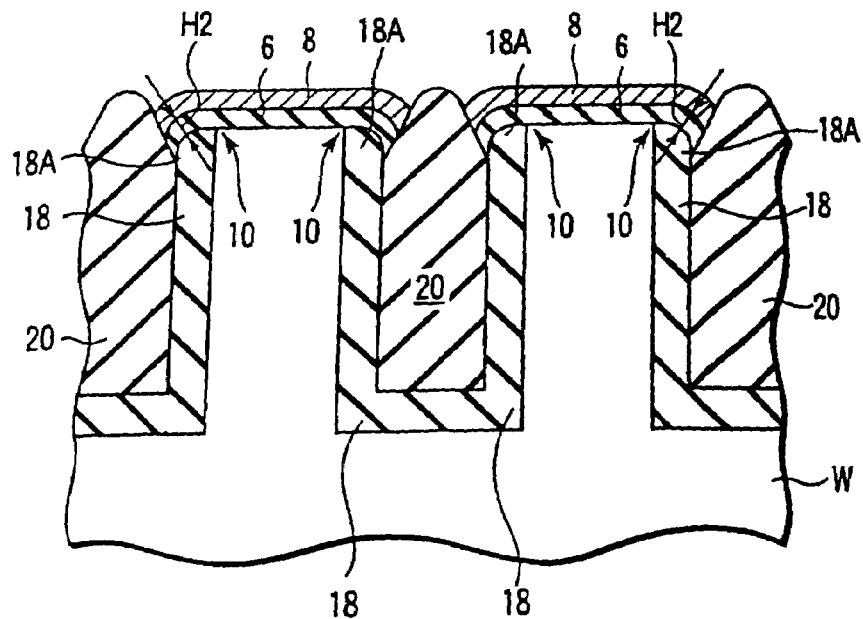
FIG. 10 is an enlarged sectional view showing a conventional trench isolation structure formed at the end of the processing method shown in FIGS. 9A to 9F.
Figure 9A:
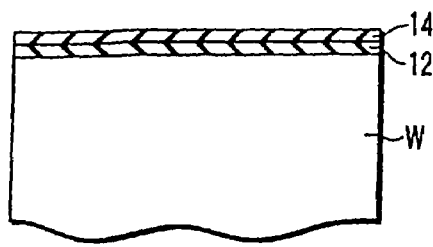
FIGS. 9A to 9F are sectional views showing a series of steps in a conventional semiconductor substrate processing method for rounding the trench edge corners of device isolation regions.
Figure 9B:
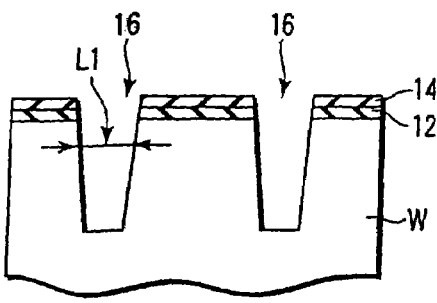
Figure 9C:
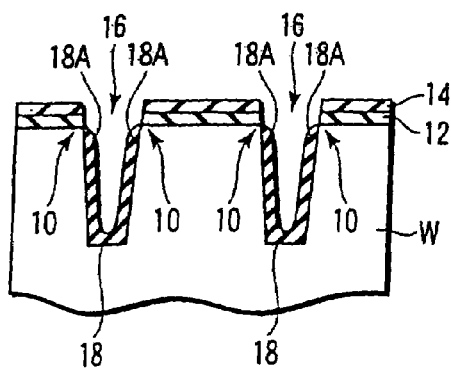
Figure 9D:
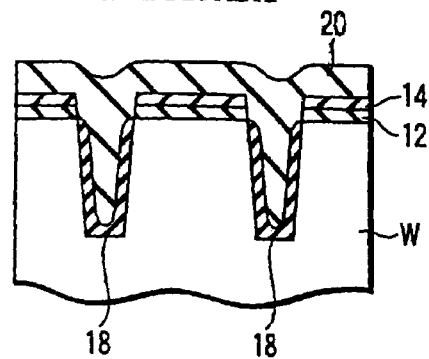
Figure 9E:
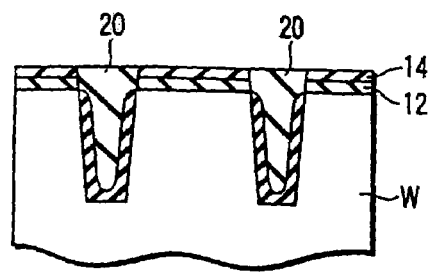
Figure 9F:
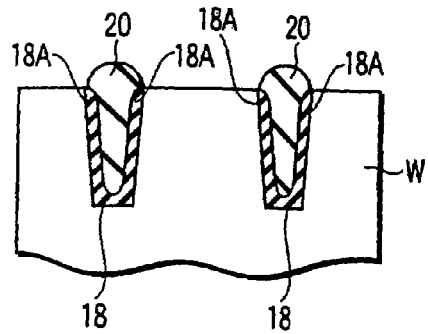

In the semiconductor devices 52 thus fabricated, as shown in FIG. 2C, the substrate surface corners 10, i.e., the edges of the trenches 16, are rounded. Accordingly, the gate oxide film 6 (see FIGS. 2H and 10) is prevented from being locally thinner, thereby suppressing leakage current. In addition, since the thick liner oxide film 18 shown in FIG. 9C need not be formed on the inner surface of the trenches 16, the trenches 16 can be filled sufficiently, avoiding creation of voids therein. Since the protection film 49 shown in FIG. 2D is far thinner than the liner oxide film 18, it does not seriously affect the width L1 of the trenches 16 (see FIG. 2B).

Next, an explanation will be given of an evaluation experiment on process conditions in the step of rounding the corners 10, as shown in FIG. 2C.

Figure 4:
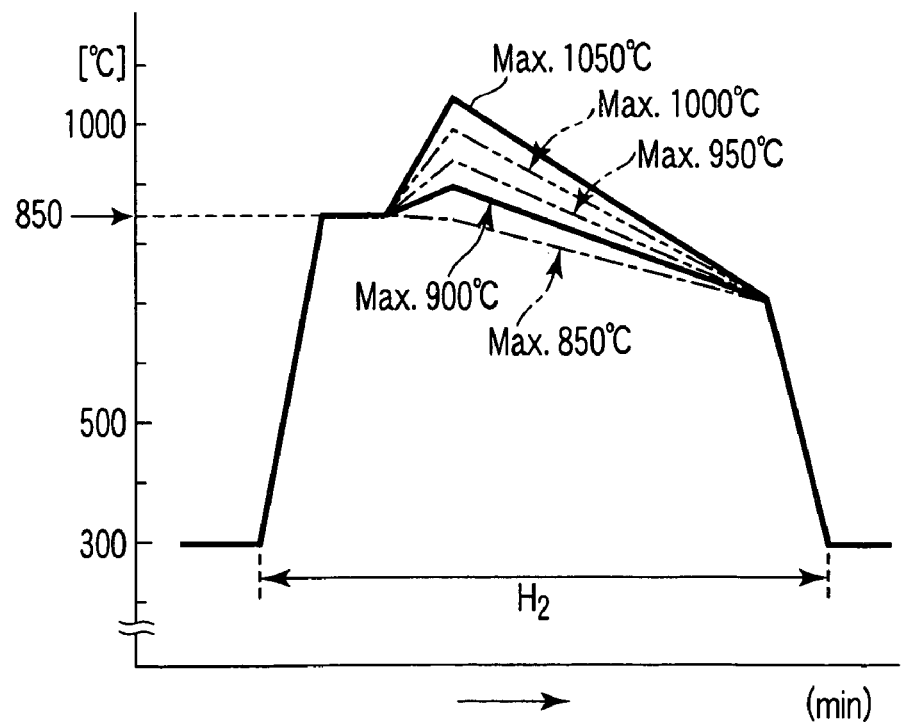
FIG. 4 is a graph showing change in the temperature of semiconductor substrates, used in an evaluation experiment in a step of rounding corners.
Figure 6:
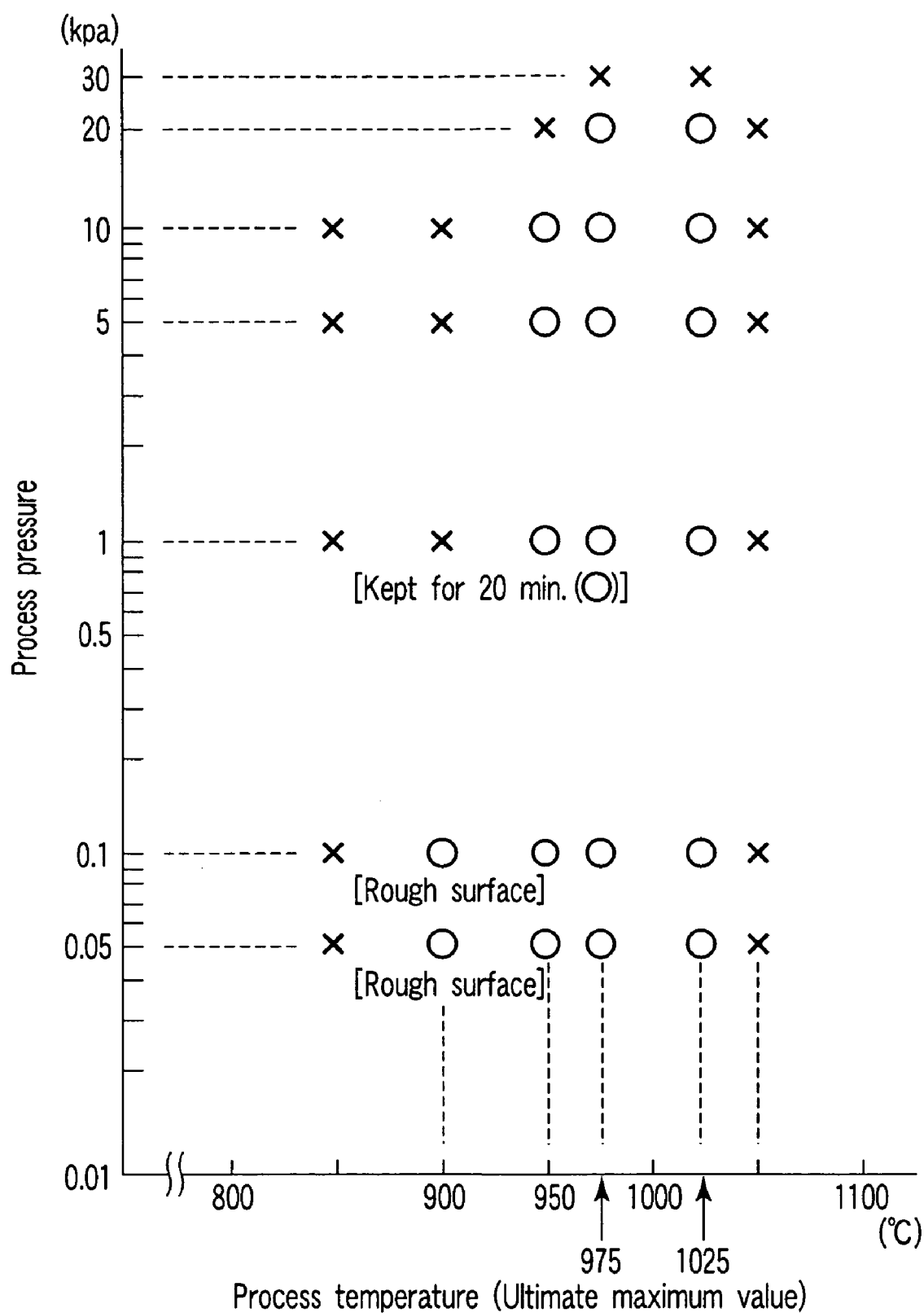
FIG. 6 is a graph showing evaluation results in terms of the relationship between process temperature and process pressure in the step of rounding corners.
Figure 8:
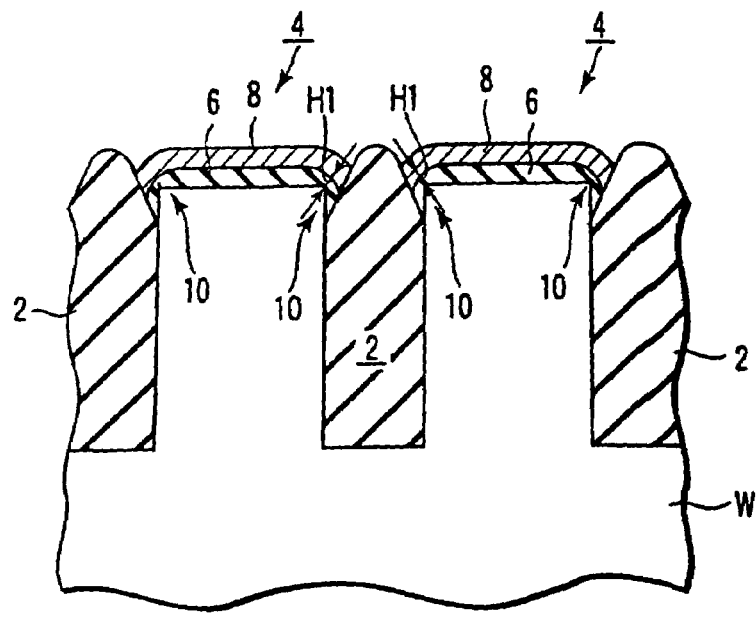
FIG. 8 is an enlarged sectional view showing a conventional trench isolation structure.

FIGS. 4 and 5 are graphs showing change in the temperature of semiconductor substrates, used in the evaluation experiment in the step of rounding corners. FIG. 6 is a graph showing evaluation results in terms of the relationship between process temperature and process pressure in the step of rounding corners.

FIGS. 7A to 7C are schematic views showing change in the shape of a trench. In FIG. 6, the symbols "○" denote good results, and the symbols "×" denote bad results.

In the evaluation experiment, the process temperature (ultimate maximum value) was set at different values at regular intervals of 50° C. in a range of 850° C. to 1,050° C. The process pressure was set at different values in a range of 0.05 kPa to 30 kPa. As a process gas, only hydrogen gas was supplied, as descried above.

The temperature of the semiconductor substrates W was controlled, as follows. Specifically, as shown in FIG. 4, semiconductor substrates W were loaded into the process container 24 (see FIG. 1) heated at about 300° C. in advance. The semiconductor substrates W were quickly heated to 850° C. and kept at this temperature for about 5 minutes to stabilize the temperature. Then, the semiconductor substrates W were heated to different ultimate maximum values in a range of 850° C. to 1,050° C., and then quickly (in a moment) cooled. After the semiconductor substrates W are cooled down, the surfaces of the substrates, such as the corners 10 of the trenches 16, were observed.

The hydrogen gas was kept supplied until the substrate temperature was lowered to about 300° C. The hydrogen gas flow is intended to prevent silicon atoms from being dissociated from the silicon surface. Because, if the supply of hydrogen gas is stopped when the substrates are at a high temperature, the interior of the process container becomes a high vacuum, thereby causing silicon atoms to be dissociated from the silicon surface.

As shown in FIG. 6, the results of the evaluation experiment revealed that, where the process temperature was set at 850° C., no good results were obtained regardless of the process pressure. It is presumed that, this was so, because 850° C. was too low as heating temperature to sufficiently cause migration. In this case, as shown in FIG. 7A, the shape of corners 10 of the trenches 16 remained angular.

Also, where the process temperature was set at 1,050° C., preferable results were not obtained regardless of the process pressure. It is presumed that, this was so, because 1,050° C. was too high as heating temperature, thereby causing excessive migration and promoting deformation. In this case, as shown in FIG. 7C, the corners 10 of the trenches 16 were rounded, but a large wide-bottomed recess 54 was formed at the bottom of the trenches 16. Since such a recess 54 may cause a void, it is not preferable.

On the other hand, where the process temperature was set at 950° C. and the process pressure was set at a value of 0.05 kPa to 10 kPa, and where the process temperature was set at 975° C. or 1,025° C. and the process pressure was set at a value of 0.05 kPa to 20 kPa, good results were obtained. In these cases, as shown in FIG. 7B, the corners 10 of the trenches 16 were suitably rounded, without forming the large recess 54 shown in FIG. 7C. Accordingly, it has been found that these conditions fall into the most pertinent scope.

Where the process temperature was set at 950° C. and the process pressure was set at 20 kPa, and where the process temperature was set at 975° C. or 1,025° C. and the process pressure was set at 30 kPa, the corners 10 were not suitably rounded.

Where the process temperature was set at 900° C. and the process pressure was set at 0.05 kPa or 0.1 kPa, the corners 10 were suitably rounded, but remarkable surface roughness was observed on its surface. Accordingly, it has been found that these conditions do not fall into the most pertinent scope, but are useful for rounding the corners 10 to some extent.

Where the process temperature was set at 900° C. and the process pressure was set at 1 kPa, the corners 10 of the trenches 16 were not rounded but maintained the shape, as shown in FIG. 7A. In this respect, it was found that, where the substrates were kept at 900° C. for 20 minutes, as shown in FIG. 5, the corners 10 of the trenches 16 were suitably rounded, as shown in FIG. 7B. This keeping time of 20 minutes is a limit value, in consideration of the throughput of the substrate process.

Where the process temperature was set at 900° C. and the process pressure was set at 5 kPa or 10 kPa, the corners 10 were not rounded even after the substrates were kept at that temperature for 20 minutes. In the present heat-processing apparatus, about 0.01 kPa is the lowest pressure that can be formed by vacuum-exhausting it while supplying hydrogen gas. Accordingly, the lowest process pressure of this process is also about 0.01 kPa.

Based on the results described above, it has been found that the following conditions are preferably used in the step of rounding the corners 10. Specifically, the process temperature T is set to be 850° C.<T<1,050° C., and the process pressure P is set to be 0.01 kPa<P<30 kPa. More preferably, the process temperature T is set to be 900° C.$\leq$T$\leq$1,025° C., and the process pressure P is set to be 0.05 kPa$\leq$P$\leq$20 kPa.

Specifically, the symbols "◯" in FIG. 6 show a scope defined by necessary and sufficient conditions. In the step of rounding the corners 10 and the step of forming the protection film 49 by oxidation shown in FIGS. 2C and 2D, the total period of time for the substrates W to be kept at the highest temperature is set at 1 to 15 minutes, and preferably at 1 to 5 minutes.

The heat-processing apparatus for performing the heat process is not limited to that shown in FIG. 1, but may be a heat-processing apparatus with a double-tube process container, or a heat-processing apparatus of the type that processes substrates one by one. The size of the semiconductor substrate may be any one of 6-inch, 8-inch, 12-inch, and so forth.

INDUSTRIAL APPLICABILITY

With a method of manufacturing semiconductor devices according to the embodiments described above (including a method of forming a device isolation region and a method of processing a semiconductor substrate), it is possible to sufficiently round substrate surface corner, i.e., the trench edges, without deforming the trench groove shape, even if the trench width is reduced.

What is claimed is:

1. A method of processing a semiconductor substrate, the method comprising:
    forming a trench in a surface of the substrate, by etching the substrate;
    rounding a corner of the substrate formed at a mouth of the trench, by heat-processing the substrate, wherein rounding the corner comprises a first heat process performed in a hydrogen gas atmosphere with a process temperature T set to be 850° C.<T<1,050° C., and a process pressure P set to be 0.01 kPa<P<30 kPa; and
    performing, subsequently to the first heat process, a second heat process to cover a surface inside the trench with a protection oxide film, by oxidizing the substrate while heating the substrate, wherein the second heat process is performed in a mixed gas atmosphere of oxygen and hydrogen with a process pressure set to be 133 Pa or less.

2. The method according to any one of claim 1, wherein the process temperature T is set to be 900° C.$\leq$T$\leq$1,025° C., and the process pressure P is set to be 0.05 kPa$\leq$P$\leq$20 kPa.

3. A method of forming a device isolation region for separating a device region on a semiconductor substrate, the method comprising:
    forming a process insulating film on the substrate;
    forming a trench extending from a surface of the process insulating film into the substrate, by etching a portion corresponding to the device isolation region;
    rounding a corner of the substrate formed at a boundary between the trench and the device region, by heat-processing the substrate while leaving the process insulating film disposed on the device region, wherein rounding the corner comprises a first heat process performed in a hydrogen gas atmosphere with a process temperature T set to be 850° C.<T<1,050° C., and a process pressure P set to be 0.01 kPa<P<30 kPa;
    performing, subsequently to the first heat process, a second heat process to cover a surface inside the trench with a protection oxide film, by oxidizing the substrate while heating the substrate, wherein the second heat process is performed in a mixed gas atmosphere of oxygen and hydrogen with a process pressure set to be 133 Pa or less;

forming a deposition film of an insulator in the trench and on the device region while leaving the process insulating film disposed on the device region; and removing both the deposition film and the process insulating film on the device region, thereby leaving an filling insulator in the trench, and forming an exposed surface of the substrate in the device region.

4. The method according to claim 3, wherein the first and second heat processes are performed in a process chamber in which a process of forming the deposition film of an insulator is performed.

5. The method according to claim 3, wherein the process temperature T is set to be 900° C.$\leq$T$\leq$1,025° C., and the process pressure P is set to be 0.05 kPa$\leq$P$\leq$<20 kPa.

6. A method of manufacturing a semiconductor device including a gate structure on a device region adjacent to a device isolation region, the method comprising:

forming a process insulating film on a semiconductor substrate used as a substrate of the semiconductor device;

forming a trench extending from a surface of the process insulating film into the substrate, by etching a portion corresponding to the device isolation region;

rounding a corner of the substrate formed at a boundary between the trench and the device region, by heat-processing the substrate, wherein rounding the corner comprises a first heat process performed in a hydrogen gas atmosphere with a process temperature T set to be 850° C.<T<1,050° C., and a process pressure P set to be 0.01 kPa<P<30 kPa;

performing, subsequently to the first heat process, a second heat process to cover a surface inside the trench with a protection oxide film, by oxidizing the substrate while heating the substrate, wherein the second heat process is performed in a mixed gas atmosphere of oxygen and hydrogen with a process pressure set to be 133 Pa or less;

forming a filling insulator in the trench;

forming an exposed surface of the substrate in the device region, after forming the filling insulator; and forming a gate insulating film and a gate electrode in this order over the exposed surface and the corner.

7. The method according to claim 6, wherein the process temperature T is set to be 900° C.$\leq$T$\leq$1,025° C., and the process pressure P is set to be 0.05 kPa$\leq$P$\leq$<20 kPa.

8. The method according to claim 6, wherein rounding the corner is performed while leaving the process insulating film disposed on the device region, and forming the filling insulator is performed by forming a deposition film of an insulator in the trench and on the device region while leaving the process insulating film disposed on the device region, and then removing both the deposition film and the process insulating film on the device region.

9. The method according to claim 8, wherein the first and second heat processes are performed in a process chamber in which a process of forming the deposition film of an insulator is performed.

* * * * *